(12) United States Patent
Hayashida et al.

(10) Patent No.: US 6,760,204 B2
(45) Date of Patent: Jul. 6, 2004

(54) SEMICONDUCTOR INTEGRATED CIRCUIT DEVICE AND METHOD FOR DESIGNING THE SAME

(75) Inventors: Yoko Hayashida, Tokyo (JP); Kiminori Hayano, Tokyo (JP); Hiroshi Furuta, Tokyo (JP)

(73) Assignees: NEC Corporation, Tokyo (JP); NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/939,870

(22) Filed: Aug. 27, 2001

(65) Prior Publication Data

US 2002/0024045 A1 Feb. 28, 2002

(30) Foreign Application Priority Data

Aug. 30, 2000 (JP) ........................................ 2000-261804

(51) Int. Cl.$^7$ ........................... H02H 9/00; H01L 23/62
(52) U.S. Cl. .............................. 361/56; 361/54; 257/355
(58) Field of Search ............................ 361/54, 56, 91, 361/111, 118, 51; 257/355, 358

(56) References Cited

U.S. PATENT DOCUMENTS

| | | | | |
|---|---|---|---|---|
| 5,477,414 A | * | 12/1995 | Li et al. ..................... | 257/355 |
| 5,515,226 A | * | 5/1996 | Tailliet ....................... | 257/355 |
| 5,942,916 A | * | 8/1999 | Matsbara et al. ............. | 326/83 |
| 5,969,929 A | * | 10/1999 | Kleveland et al. .......... | 361/111 |
| 6,385,028 B1 | * | 5/2002 | Kouno ....................... | 361/111 |

FOREIGN PATENT DOCUMENTS

| | | |
|---|---|---|
| JP | 2570610 | 7/1995 |
| JP | 8-055958 | 2/1996 |
| JP | 11-191732 | 2/1996 |
| JP | 2830783 | 2/1997 |
| JP | 11-150236 | 6/1999 |
| JP | 11-297930 | 10/1999 |

* cited by examiner

*Primary Examiner*—Brian Sircus
*Assistant Examiner*—Danny Nguyen
(74) *Attorney, Agent, or Firm*—Darryl G. Walker; Bradley T. Sako

(57) ABSTRACT

A semiconductor integrated circuit device is disclosed that can provide greater flexibility of layout while essentially ensuring circuit characteristics, and at the same time providing an minimum electrostatic discharge breakdown withstand value according to Charged Device Model (CDM) at all input/output (I/O) terminals. For each I/O terminal a size of a CDM protective device can be optimized in response to reference electric potential wiring resistance between an input protective device, a MOSFETs that can constitute an internal circuit, and an input resistance.

9 Claims, 5 Drawing Sheets

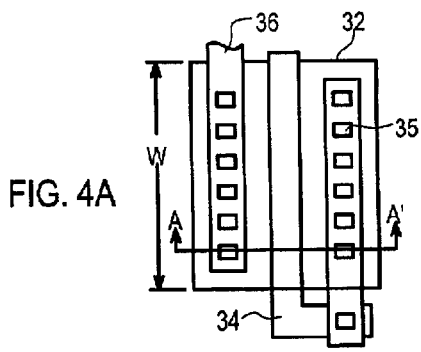
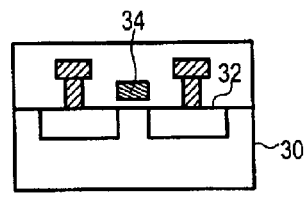
FIG. 4A  FIG. 4B
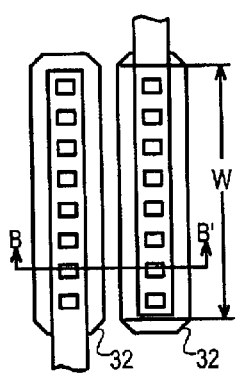
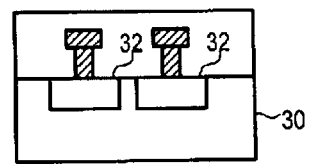
FIG. 5A  FIG. 5B
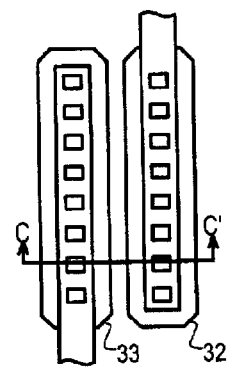
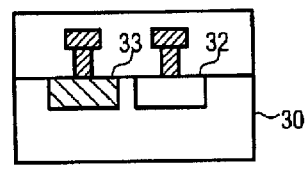
FIG. 6A  FIG. 6B
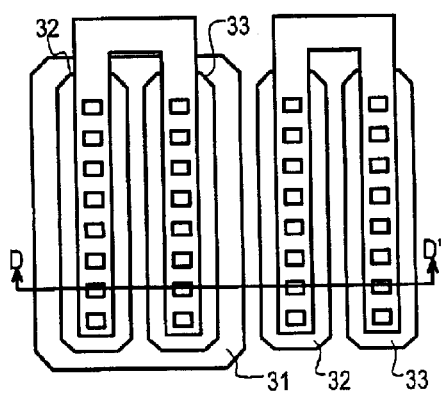
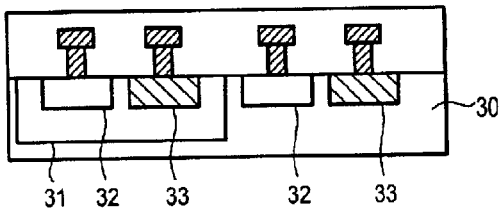
FIG. 7A  FIG. 7B

SEMICONDUCTOR INTEGRATED CIRCUIT DEVICE AND METHOD FOR DESIGNING THE SAME

TECHNICAL FIELD

The present invention relates generally to a semiconductor integrated circuit device and a method for designing the same, and more specifically to a semiconductor integrated circuit device that include insulated gate field effect transistors (IGFETs) (such as Metal-Oxide-Semiconductor (MOS) FET (Field Effect Transistor)) and a method of designing the same.

BACKGROUND OF THE INVENTION

As semiconductor device features becomes finer and the integration of such devices increases, an important concern can be electrostatic discharge (ESD). Electrostatic discharge can result when a static electricity, or the like, is discharged into or from a semiconductor device. ESD may result in damage to a semiconductor device, causing such a device to immediately fail, or have decreased reliability. One particular failure mechanism can be a breakdown of the gate dielectric in an insulated gate field effect transistor, such as the gate oxide of a metal-oxide-semiconductor FET.

ESD is believed to occur at various stages in a manufacturing process when semiconductor devices are handled and transported, for example.

Various models of the ESD breakdown phenomenon have been proposed, including a human body model (Human Body Model: HBM), a machine model (Machine Model: MM), and a charged device model (Charged Device Model: CDM).

In the HBM model, electric charges are generated, and then discharged to a device when a charged human makes contact with the device. In the MM model, electric charges are generated on a metal instrument, or the like, and then discharged to a semiconductor device when the instrument and device contact one another. In general, such a metal instrument can have a larger electrostatic capacitance than a human body, but also have a lower discharge resistance than a human body.

Using the above-mentioned models, semiconductor devices may be appraised for resistance/susceptibility to ESD events. For appraisal according to HBM and MM models, electric charges can be applied between two predetermined terminals of a device. In contrast, for appraisal according to a CDM model, a package and a chip of the device can be charged with electricity. Such charge can then be discharged to an outside location through terminals of the device.

To better understand the present invention, conventional approaches to semiconductor devices and ESD protection will be described below, including descriptions of a CDM model and a general counter measure to CDM type events.

Referring now to FIG. 15, an example of a semiconductor integrated circuit device is shown in a block diagram and designated by the general reference character 100. FIG. 15 shows various terminals and an internal circuit of a semiconductor integrated circuit device 100.

As illustrated in FIG. 15, a semiconductor integrated circuit device includes a terminal 110 that is connected with a gate of a MOSFET 112 through an input resistance Rin 114. A MOSFET 112 is illustrative of an internal circuit of a semiconductor device 100. An input resistor 114 is illustrative of an input resistance and an input wiring resistance inherent in semiconductor device 100.

A semiconductor device 100 also includes an electrostatic protective device, referred to herein as a clamping device 111. A clamping device 111 is connected between terminal 110 and reference electric potential wiring 117. A reference electric potential wiring 117 can be a ground (GND) wiring and/or a substrate electric potential wiring that may be operated at a different potential than GND. Electrostatic protective device 111 serves to prevent MOSFET 112 from being subjected to static electricity that is applied from the outside to terminal 110. Such static electricity may result in a MOSFET 112 being damaged.

Electrostatic protective device 111 is generally provided to protect the semiconductor device 100 from the aforementioned human body model (HBM) and machine model (MM) type events. The structure and size of electrostatic protective device 111 are selected to sufficiently insulate the semiconductor device 100 from HBM and MM type ESD events.

Referring again to FIG. 15, a capacitor 120 is also shown. A capacitor 120 can designate the equivalent capacitance of a semiconductor device 100 with respect to earth GND, when such a semiconductor device is being tested according to the CDM model. Electric charges with a semiconductor device may be stored on a capacitor 120.

During a test, terminal 110 is grounded through a CDM test switch 121. In the CDM test, electric charges on the device (i.e., all electric charges over the entire chip) are discharged to ground from terminal 110, through reference electric potential wiring 117 and electrostatic protective device 111. Reference electric potential wiring 117 includes reference electric potential wiring resistance Rg 116.

In addition, during a CDM type test, charge stored on a gate of MOSFET 112 can be discharged from terminal 110 to the ground. As noted above, charge on a gate of MOSFET 112 can constitute the charge on an internal circuit of a semiconductor device 100. The electric charge stored on the gate of MOSFET 112, that constitutes that of an internal circuit, can be substantially less than the charge discharged through the reference electric potential wiring 117. Consequently, charge on the gate of MOSFET 112 can be discharged to ground in a relatively shorter time that a reference electric potential wiring 117.

Such a faster discharge time may result in a relatively large electric potential developing between a gate of MOSFET 112, which has been discharged, and a source of MOSFET 112, which may be at the still discharging potential of reference electric potential wiring 117. Unless addressed, such an electric potential may breakdown the gate oxide film of a MOSFET 112, or otherwise damage a MOSFET 112.

To preventing such a breakdown there is generally provided a CDM protective device, also referred to as clamp device 113, that is in close vicinity to a MOSFET 112, between the gate and source of MOSFET 112.

A prior art technique for addressing ESD is shown in Electrical Overstress/Electrostatic Discharge Symposium Proceeding September 27–29, pp.220–227, 1988, referred herein as Reference 1. Reference 1 discloses that an input resistance, such as that shown as Rin 114 in FIG. 15, is effective for addressing HBM and MM type ESD events.

It is noted that an increase of an input resistance, such as Rin 114 in FIG. 15, may adversely affect circuit performance. Thus, there can be a tradeoff relationship between ESD protection and circuit performance. For this reason, it can be necessary to select an optimum value of an input resistance, Rin 114, that accounts for such a tradeoff relationship.

Additional prior art techniques are shown in Electrical Overstress/Electrostatic Discharge Symposium Proceeding, pp. 116 to 123, 1999 (referred to herein as Reference 2). Reference 2 discloses a relationship between an input resistance, such as Rin 114 of FIG. 15, a reference electric potential wiring resistance, such as Rg 116 in FIG. 15, and CDM insulation.

Referring now to FIG. 16, a simulation result of ESD for a device, such as that shown in FIG. 15 is shown. FIG. 16 shows how an electric potential difference (Vox) between the gate and the source of MOSFET 112 can vary over time during an ESD event. In particular, FIG. 16 shows how the electric potential differences (Vox) changes in response to the action of CDM protective device 113 during CDM testing. Three curves are shown; curves (a) to (c).

Curve (a) shows a change in Vox when CDM protective device 113 is completely clamped. The response of Vox is shown to sharply change in curves (b) and (c) as the operation of CDM protective device 113 varies. Curve (c) in particular demonstrates a Vox response where MOSFET 112 is destroyed during the CDM test.

It is noted that the value of Vox that can result in the destruction of a MOSFET 112 varies according to such factors as the thickness of the gate oxide film of a MOSFET 112.

Generally, semiconductor device resistance to CDM type events can be increased as an input resistance, such as Rin 114, is increased and reference electric potential wiring resistance, such as Rg 116, is decreased.

While an input resistance and reference electric potential wiring resistance can effect how a semiconductor device responds to CDM type events, the value of such resistances may be limited by circuit design considerations. For example, maximum values of an input resistance, such as Rin 114, and a reference electric potential wiring resistance, such as Rg 116, can be based upon an allowable range corresponding to overall circuit characteristics. Circuit simulation can determine such a range.

It is further noted that an input resistance (like Rin 114) can have a minimum value determined on the basis of HBM and MM test results. In addition, a reference electric potential wiring resistance (like Rg 116) can have a minimum value determined according to the layout of a semiconductor device.

Other prior art techniques are known that include constructing a testing device to perform actual ESD tests. The results of the test are reflected on the design of the actual device. In such cases, the structure of an electrostatic protective device (such as 111) and a CDM protective device (such as 113) can both being determined. Such devices may be repeated in size and structure for all input terminals and output terminals of a semiconductor device.

While numerous approaches to ESD protection have been described, a problem remains in conventional semiconductor devices and methods of design. The problem arises from variations in a reference electric potential wiring resistance (such as Rg 116). These variations may occur when a reference electric potential wiring is commonly connected with electrostatic protective devices and circuit devices such as MOSFETs, or even cases where a reference electric potential wiring is independently connected with electrostatic protective devices and circuit devices.

A specific example describing variations in the resistance of a reference electric potential wiring will now be described with reference to FIG. 17. FIG. 17 shows a semiconductor integrated circuit device that includes a reference electric potential wiring 117 that is commonly connected to electrostatic protective devices 111a to 111c. Electrostatic protective devices (111a to 111c) and commonly connected wiring 117 may also be connected to MOSFETS 112a to 112c included within internal circuits 150a to 150c. Internal circuits (150a to 150c) include CDM protective devices 113a to 113c. Further, each internal circuit (150a to 150c) may correspond to an input/output (I/O) terminal 110a to 110c.

In the arrangement of FIG. 17, a reference electric potential wiring resistance Rg can vary according to the position of an I/O terminal (110a to 110c) and the position of a corresponding the internal circuit (150a to 150c). Such a variation arises due to differences in wiring lengths of reference electric potential wiring 117 for various different circuits. In particular, wiring lengths between points N1a and N2a, may be different from a length between points N1b and N2b, which may be different from that between points N1c to N2c. This can result in correspondingly different reference electric potential wiring resistances Rg.

Yet another example for showing how a reference electric wiring potential Rg can vary is shown in FIG. 18. In FIG. 18, a conventional semiconductor integrated circuit device is shown that includes a reference electric potential wiring 118 that is connected to electrostatic protective devices 111a to 111c, and a ground electric potential wiring 119 for MOSFETs 112a to 112c. MOSFETs (112a to 112c) may be representative of internal circuits (150a to 150c) of a semiconductor device. Internal circuits (150a to 150c) include CDM protective devices 113a to 113c. In FIG. 18, the reference electric potential wiring 118 and ground electric potential wiring 119 are constructed with separate wiring branches from GND terminal 115.

In the arrangement of FIG. 18, a difference in reference electric potential wiring resistance Rg can depend upon the distance between I/O terminals 110a to 110c and GND terminal 115. Even more particularly, a reference electric potential wiring resistances Rg in FIG. 18 can be the wiring resistance between electrostatic protective devices (111a to 111c) and respective MOSFETs 112a to 112c of the internal circuit, in which wiring paths passing through a branch point N0 are considered.

Thus, in FIG. 18, reference electric potential wiring resistances Rg for I/O terminal 110a can vary according to a wiring resistance of the path N1a-N0-N2a, Rg for I/O terminal 110b can vary according to a wiring resistance of the path N1b-N0-N2b, and Rg for I/O terminal 110c can vary according to a wiring resistance of the path N1c-N0-N2c.

The case of FIG. 18 can differ from that of FIG. 17, in that a difference between CDM withstand amounts at input and output terminals can be more conspicuous.

Conventionally, a size of CDM protective devices (such as 113a to 113c of FIGS. 17 and 18) can be initially estimated with a test device. For redundancy in the formation of such devices, an actual CDM protective device size can be larger than such an initial estimation. Further, once a size of a CDM protective device is determined, the same size CDM protective device can be used for all input and output terminal of a semiconductor device. This can limit a layout of an internal circuit.

In light of the above discussion, it would be desirable to arrive at some way of providing a semiconductor integrated circuit device with flexibility in layout, while at the same time maintaining certain circuit characteristics, and providing a predetermined CDM withstand amount at all I/O terminals.

It would also be desirable to provide a method of designing a semiconductor integrated circuit device that gives flexibility in layout, while at the same time maintaining certain circuit characteristics, and providing a predetermined CDM withstand amount at all I/O terminals.

SUMMARY OF THE INVENTION

A semiconductor integrated circuit device according to the present invention may include insulated gate field effect transistors (IGFETs) (such as metal-oxide-semiconductor FETs, or MOSFETs) having gates connected to input/output (I/O) terminals through a first resistance. First clamping devices can be connected to each I/O terminal. Second clamping devices can be connected between the gate and source of each IGFET. First and second clamping devices associated with the same I/O terminal can be connected to one another through a second resistance.

According to one aspect of the embodiments, second clamping devices corresponding to different I/O terminals can have different capabilities.

According to another aspect of the embodiments, first resistances corresponding to different I/O terminals can be varied to establish a maximum second-to-first resistance ratio.

A method of designing a semiconductor integrated circuit device according to the present invention can include designing an electrostatic protective circuit and a protective device for a semiconductor integrated circuit device that includes an IGFET provided on a semiconductor substrate. According to a method of the present invention, a simulation may be performed on a predetermined CDM test equivalent circuit. Such a test circuit may include a first clamping device connected to an I/O terminal, a first IGFET having a gate connected to the I/O terminal through a first resistance, a second clamping device connected between a gate electrode and source drain electrode of the first IGFET, and the first and second clamping devices being connected to one another through a second resistance.

From such simulation results, a ratio between the second resistance and first resistance can be determined such that an electric potential difference between the gate electrode of the first IGFET and the source or substrate electrode of the same does not exceed a predetermined value.

In accordance with the present invention, flexibility of a layout may be provided without losing circuit characteristics. Further, a same CDM withstand amount may be maintained between I/O terminals. In this way, a semiconductor integrated circuit device having satisfactory CDM withstand amounts at all input and output terminals may be provided.

In addition, according to the present invention a design for a semiconductor integrated circuit device having a satisfactory CDM withstand amount can be effectively and accurately achieved.

BRIEF DESCRIPTION OF THE DRAWINGS

FIG. 4A is a plan view illustrating an example of a charged device mode (CDM) protective device (second clamping device) for use in a semiconductor integrated circuit according to the present invention; FIG. 4B is a side cross sectional view taken along line A–A' of FIG. 4A.

FIG. 5A is a plan view further illustrating another example of a CDM protective device (second clamping device) for use in a semiconductor integrated circuit device according to the present invention; FIG. 5B is a side cross sectional view taken along line B–B' of FIG. 5A.

FIG. 6A is a plan view illustrating yet another example of a CDM protective device (second clamping device) for use in the semiconductor integrated circuit device according to the present invention; FIG. 6B is side cross sectional view taken along line C–C' of FIG. 6A.

FIG. 7A is a plan view illustrating still another example of a CDM protective device (second clamping device) for use in the semiconductor integrated circuit device according to the present invention; FIG. 7B is a side cross sectional view taken along line D–D' of FIG. 7A.

DETAILED DESCRIPTION OF THE EMBODIMENTS

In the following, various approaches of the present invention will be described with reference to the accompanying drawings. Various preferred embodiments will be described in detail.

First Embodiment.

Figure 1:
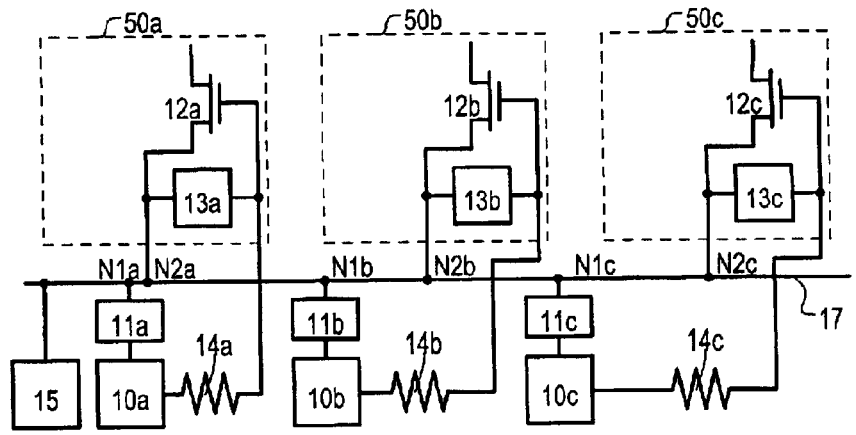
FIG. 1 is a circuit diagram illustrating the arrangement of a semiconductor integrated circuit device of a first embodiment according to the present invention.

Referring to FIG. 1, a semiconductor integrated circuit device according to a first embodiment of the present invention is illustrated in which all input/output (I/O) terminals 10a, 10b, 10c can be connected with reference electric potential wiring (GND) 17 through electrostatic protective devices (first clamping devices) 11a, 11b, 11c. I/O terminals 10a to 10c may also be connected to gates of MOSFETs 12a, 12b, 12c, respectively. MOSFETs 12a, 12b, and 12c may constitute an internal circuit accessed through input resistance Rin 14a, 14b, and 14c, respectively.

Input resistances Rin 14a to 14c can comprise respective resistance components of various semiconductor device structures, including polycrystalline silicon, signal wirings, and contacts. Contact resistance components can comprise those structures for connecting diffusion layers of CDM protective devices 13a to 13c and input signal wirings, and those structures of a contact portion that can connect polycrystalline silicon layer and input signal wirings.

CDM protective devices (second clamping devices) 13a, 13b, 13c can be in close vicinity to MOSFETs 12a to 12c, situated between the between gates and sources of MOSFETs 12a to 12c.

It is noted that in the embodiment of FIG. 1, an input resistance Rin and reference electric potential wiring resistance Rg can be different for each of terminals 10a to 10c according to a distance of from MOSFETs 12a to 12c.

A reference electric potential wiring resistance Rg can comprise a wiring resistance component and a contact resistance component related to a contact that connects CDM protective devices 13a to 13c and electrostatic protective devices 11a to 11c. Such a resistance may include that of a diffusion layer.

Various examples of differences in a reference electric potential wiring resistance Rg will now be noted with reference to FIG. 1. Such examples will refer to particular points on a reference electric potential wiring 17 shown as N1a, N2a, N1b, N2b, N1c and N2c. Rg between N1a and N2a, related to I/O terminal 10a, can be about 5 ohms. Rg between N1b and N2b, related to I/O terminal 1b, can be about 10 ohms. Rg between N1c and N2c, related to I/O terminal 10c, can be about 20 ohms.

To better understand a semiconductor device and method of design according to the present invention, a discussion of CDM withstand values will now be discussed. A CDM withstand value can be the voltage that may be received before a device can fail and/or be damaged.

Figure 11:
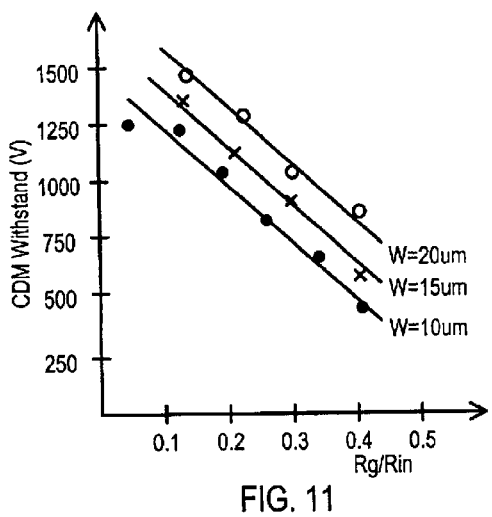
FIG. 11 is a graph showing a relationship between a CDM withstand value of a test device and ratio between a reference electric potential wiring resistance and an input resistance (Rg/Rin).

The present inventors have found that in an embodiment such as that shown in FIG. 1, a CDM withstand amount has a relationship with respect to the ratio of input resistance Rin and reference electric potential wiring resistance Rg (Rg/Rin). This relationship is represented in FIG. 11. As shown in FIG. 11, a CDM withstand amount (the axis of ordinates) can increase as a ratio (Rg/Rin) is decreased. FIG. 11 shows examples of CDM withstand voltages for various sizes of CDM protective devices (such as 13a to 13c, in FIG. 1). Sizes are shown as values "W" and are micrometers (microns). Three particular examples are shown, including 10 micrometers, 15 micrometers, and 20 micrometers.

From FIG. 11 it can be shown that even if two CDM protective devices have the same size (W), differences in the ratio (Rg/Rin) for the devices can result in different CDM withstand values.

Referring back to FIG. 1, a relationship such as that shown in FIG. 11 can be used to select sizes for CDM protective devices 13a to 13c. More particularly, if a ratio Rg/Rin is smaller, a size of a corresponding CDM protective device (13a to 13c) can be smaller. Thus, Rg resistance values of 5 ohm, 10 ohm and 20 ohm for I/O terminals 10a to 10c, respectively, may result in a CDM protective devices 13a to 13c having increasingly larger sizes. As but one example, a CDM protective device 13a can have a size W of 10 microns, a CDM protective device 13b can have a size W of 15 microns, and a CDM protective device 13c can have a size W of 20 microns.

In this way, sizes of CDM protective devices 13a to 13c can be determined according to a corresponding ratio (Rg/Rin). This can eliminated different CDM withstand values for various inputs, as can exist in prior art approaches, due to same size CDM protective devices and varying ratios (Rg/Rin).

Further, because a size of a CDM protective device 13a to 13c can be determined according to the values of (Rg/Rin), in those positions where the values of (Rg/Rin) are small, a CDM protective device can be smaller. This can result in CDM protective devices having particular withstand values that are not any larger than needed. Accordingly, unlike conventional approaches that include same size CDM protective devices, wasted use of space can be eliminated. By freeing up more space than conventional approaches, flexibility in the layout and/or design of a semiconductor device may be improved.

According to the present embodiment, two or more kinds of CDM protective devices 13a to 13c, each having different capabilities, can be provided on the same chip.

It is noted that that CDM protective devices 13a to 13c can preferably be disposed as close to MOSFETs 12a to 12c as possible to minimize any resistance therebetween. In particular, while there may be situations where CDM protective devices 13a to 13c may be separated from corresponding MOSFETs 12a to 12c due to a layout limitation, a resistance component of a wiring, or the like, that connects CDM protective devices 13a to 13c can be as small as possible.

Even more particularly, it is desirable that a resistance component of a wiring that connects gate electrodes of MOSFETs 12a to 12c to CDM protective devices 13a to 13c can be essentially ignored when compared with an input resistance component Rin. Likewise, a resistance component of a wiring that connects CDM protective devices 13a to 13c and to a source electrode of MOSFETs 12a to 12c can be essentially ignored when compared with a reference electric potential wiring resistance Rg. According to the present embodiment, such a resistance component may be 1% or less with respect to each of Rin and Rg. In one approach, this may include providing wiring lengths between a MOSFETs 12a to 12c and CDM protective devices 13a to 13c that can be within about 100 micrometers.

Second Embodiment

The arrangement of a semiconductor integrated circuit device according to the second embodiment can differ from that in the aforementioned first embodiment there may be two separately constructed reference electrical potential wirings. In particular, one reference electric potential wiring may be connected with the electrostatic protective device, while another reference electric potential wiring may be connected to circuit structures, such as MOSFETs, that can constitute an internal circuit of a semiconductor integrated circuit device.

Figure 2:
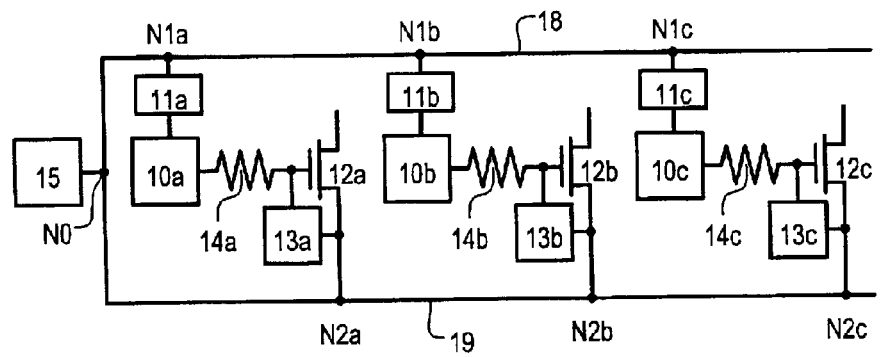
FIG. 2 is a circuit diagram illustrating the arrangement of a semiconductor integrated circuit device of a second embodiment according to the present invention.

A particular example of a semiconductor integrated circuit device according to a second embodiment is shown in FIG. 2. A second embodiment may include a reference electric potential wiring 18 that may be connected to electrostatic protective devices 11a to 11c, and a reference electric potential wiring 19 that may be connected to MOSFETs 12a to 12c, that can constitute an internal circuit. Reference electrical potential wirings 18 and 19 may be separate independent wirings branches from a reference electric potential terminal (GND terminal) 15.

In an embodiment such as that shown in FIG. 2, there may be larger difference in a reference electric potential wiring resistances Rg than the first embodiment shown in FIG. 1. As would be clear from the previous discussions, a resistance Rg for I/O terminals 10a to 10c, can be a resistance included within a path defined by points N1a-N0-N2a, N1b-N0-N2b, N1c-N0-N2c, respectively.

It is noted that the sizes of CDM protective devices 13a to 13c may be optimized as in the first embodiment. However, as indicated in FIG. 11, a CDM withstand amount can become higher if an input resistance is increased, while a reference electric potential wiring resistance Rg remains the same.

A particular example of a second embodiment will now be described with a particular resistance values. It will be first be assumed that a reference electric potential wiring resistance Rg corresponding to I/O terminal 10a can be about 7 ohms, a reference electric potential wiring resistance Rg corresponding to I/O terminal 10b can be about 15 ohms, and reference electric potential wiring resistance Rg corresponding to I/O terminal 10c can be about 30 ohms. Further, it will be assumed that a minimum input resistance Rin value is about 100 ohms, based upon the results of tests for HBM and MM type models. Finally, a value for a ratio (Rg/Rin) is needed to be about 0.15 or less, taking CDM test data into consideration. Under such conditions, input resistances Rin 14a to 14c may be 100 ohms, 100 ohms, 200 ohms, respectively. In the particular applications anticipated, a value of 200 ohms as input resistance Rin is believed to not adversely effect overall circuit characteristics.

As a matter of course, there may be occasions where it may not be possible to increase input resistance Rin to as high a value as 200 ohms, because of a products particular needs and/or characteristics. In such a case, a high enough CDM withstand value may still be achieved by altering the size a CDM protective device, as noted in conjunction with the first embodiment of FIG. 1.

In this way, a second embodiment may demonstrates the same general effect as a first embodiment, even in cases where a semiconductor integrated circuit device includes a relatively large reference electric potential wiring resistance Rg. Of course, although the described embodiment includes reference electric potential wirings 18, 19 that are constructed with separate wirings branched from GND terminal 15, the same effect may also be achieved when a wiring of another system is connected to a GND terminal 15.

Third Embodiment.

Figure 3:
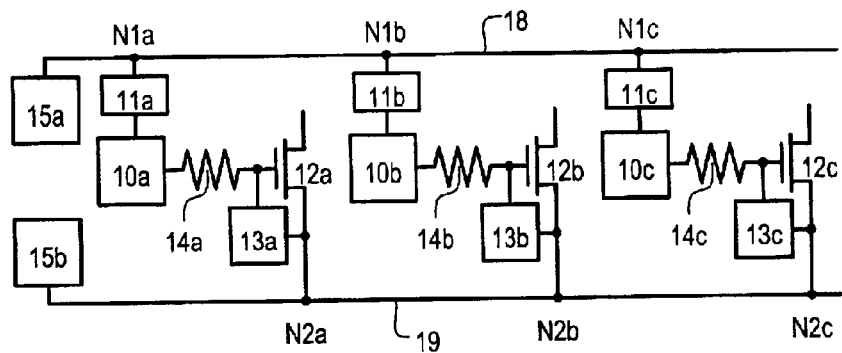
FIG. 3 is a circuit diagram illustrating the arrangement of a semiconductor integrated circuit device of a third embodiment of the present invention.

A third embodiment is illustrated in FIG. 3. A third embodiment may differ from that of the aforementioned second embodiment in that electrostatic protective devices and internal circuits (such as MOSFETs) may be connected to different reference electric potential wirings. Such different reference electric potential wirings may be connected to different reference electric potential terminals.

One particular example of a third embodiment is shown in FIG. 3. FIG. 3 shows a semiconductor integrated circuit device 3 that includes a reference electric potential terminal (GND terminal) 15a that is different from another reference electric potential terminal (GND terminal) 15b. A reference electric potential wiring 18 may be connected to a reference electric potential terminal (GND terminal) 15a and electrostatic protective devices 11a to 11c. A reference electric potential wiring 19, that is separate from that of reference electric potential wiring 18, may be connected to a reference electric potential terminal (GND terminal) 15b and to MOSFETs 12a to 12c, which may constitute internal circuits of a semiconductor integrated circuit device.

Two reference electric potential terminals 15a, 15b may be connected with the same pin of an integrated circuit package through various package structures, including but not limited to bonding wires, or leads, or the like.

In a third embodiment, a reference electric potential wiring resistance Rg for given I/O terminals 10a to 10c can vary according to position. As but one example, a reference electric potential wiring resistance Rg for I/O terminal 10a may include a resistance component of a wiring between a point N1a and reference electric potential terminal 15a, another resistance component of a wiring between point N2a and reference electric potential terminal 15b, and yet another resistance component of both reference electric potential terminals 15a and 15b, as well as bonding wires or leads that may connect such terminals.

Given reference electric potential wiring resistance Rg as noted above, in a third embodiment CDM protective device sizes (capabilities) and/or input resistance Rin may be varied for corresponding for I/O terminals in the same general fashion as the first and second embodiments. In this way, the beneficial effects of the first and/or second embodiment may be realized in a third embodiment.

While various embodiments have been shown that include CDM protective devices (13a to 13c), particular examples CDM protective device will now be described. A CDM protective device (second clamping devices, such as 13a to 13c), may take a variety of forms, including a MOSFET having has a gate electrode connected to a source electrode, an NPN bipolar device, a diode, or a thyristor, and/or combinations thereof.

A CDM protective device comprising a MOSFET is shown in FIGS. 4A and 4B. FIG. 4A is a plan view. FIG. 4B is a side cross sectional view taken along line A–A' of FIG. 4A. A MOSFET may comprise a P-type substrate 30, an N-type diffusion region 32, and a gate electrode 34. A gate electrode 34 may be connected to a source electrode 35. A drain electrode 36 is also shown.

A CDM protective device comprising an NPN bipolar device is shown in FIGS. 5A and 5B. FIG. 5A is a plan view. FIG. 5B is a side cross sectional view taken along line B–B' of FIG. 5A. An NPN bipolar device may include a P-type substrate 30 having N-type diffusion regions 32.

A CDM protective device comprising a diode is shown in FIGS. 6A and 6B. FIG. 6A is a plan view. FIG. 6B is a side cross sectional view taken along line C–C' of FIG. 6A. A diode may include a P-type substrate 30 having an N+ diffusion region 32. In addition, a P+ diffusion region 33 may be formed opposite to an N+ diffusion region 32.

A CDM protective device comprising a thyristor is shown in FIGS. 7A and 7B. FIG. 7A is a plan view. FIG. 7B is a side cross sectional view taken along line D–D' of FIG. 7A. A thyristor (semiconductor-controlled rectifier, or SCR) may include a PNPN structure. Such a structure may include a P-type substrate 30, N well regions 31, N+ diffusion regions 32, and P+ diffusion regions 33.

The capability of a CDM protective device can be varied by changing its size (length of a discharge passage) and by changing its arrangement (layout) and its structure (kinds of the aforementioned protective devices). It is generally possible to select an optimum construction and structure of a CDM protective device in response to an associated process.

It is further noted that electrostatic protective devices (first clamping device), such as those shown as 11a to 11c in FIGS. 1 to 3, may have the same structure as the aforementioned CDM protective device (MOSFET, NPN bipolar device, diodes, or thyristor, etc.). However, the size of an electrostatic protective device itself may be larger than that of the CDM protective device.

Still further, it is understood that CDM protective devices, such as those shown in FIGS. 4 to 7 may be combined.

A conventional electrostatic protective device that includes two clamping devices is known. Such a conventional structure is shown in FIG. 19, and includes a first clamping device 200, a second clamping device 201, and resistance device 214 (a circuit diagram is illustrated also in reference 1, noted in the Background of the Invention).

Figure 19:
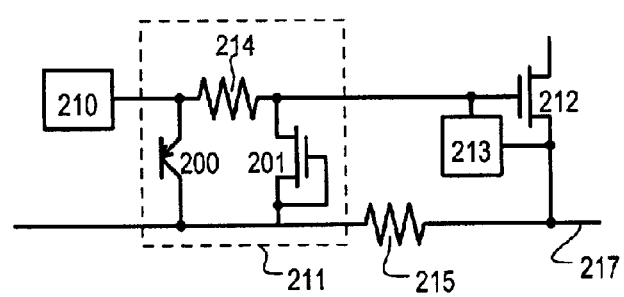
FIG. 19 is a circuit diagram illustrating yet another arrangement of the conventional semiconductor integrated circuit device.

In the example of FIG. 19, a clamping device 201 includes a resistance 214 as shown. In a CDM test, electricity may be discharged through the clamping device. However, due to the presence of a reference electric potential wiring resistance 215, the conventional arrangement of FIG. 19 may not achieve the various advantages of the described embodiments.

An object of the present invention may be achieved by applying the present invention as illustrated in the first to third embodiments.

Fourth Embodiment.

Figure 8:
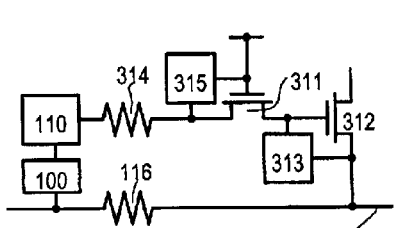
FIG. 8 is a circuit diagram illustrating the arrangement of a semiconductor integrated circuit device of a fourth embodiment of the present invention.

An arrangement of a semiconductor integrated circuit device according to a fourth embodiment is illustrated in FIG. 8. A fourth embodiment may differ from that of a first embodiment in that a transfer MOSFET can be connected with an input side of a MOSFET that can constitute an internal circuit.

In the example of FIG. 8, a transfer MOSFET 311 can be connected to an input side of a MOSFET 312 to form an input circuit. In FIG. 8, electric charge stored on a gate electrode of MOSFET 312 can be discharged through transfer MOSFET 311 during a CDM test. In such a case, an input resistance Rin may comprise a resistance 314 and an effective channel resistance of a MOSFET 311. A resistance 314 can protect a diffusion layer of transfer MOSFET 311.

In a fourth embodiment, in light of changes in Rin (with respect to other embodiments) a resistance 314 and/or effective channel resistance of a MOSFET 311 can be optimized to achieve a desired CDM withstand value. In addition or alternatively, CDM withstand values may be achieved by alternating a size of a CDM protective device 313.

In accordance with the aforementioned arrangement, according to a fourth embodiment, a desired CDM withstand value may be ensured.

It is noted that in the particular arrangement of FIG. 8, a protective device 315 can be provided between a gate of MOSFET 311 and the diffusion layer as illustrated in FIG. 8. Such a device may be a CDM protective device for MOSFET 311. Such a CDM protective device is generally employed and is disclosed in Japanese Laid-Open Patent Publication No. Hei 11-150236 (JP, 11150236, A).

Fifth Embodiment.

Figure 9:
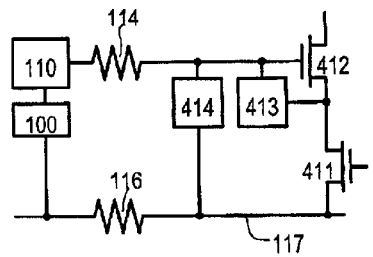
FIG. 9 is a circuit diagram illustrating the arrangement of a semiconductor integrated circuit device of a fifth embodiment of the present invention.

An arrangement of a semiconductor integrated circuit device according to a fifth embodiment is illustrated in FIG. 9. A fifth embodiment may differ from a fourth embodiment in that one electrode of MOSFET that constitutes an internal circuit can be connected with a reference electric potential wiring through MOSFET.

In the example of FIG. 9, a semiconductor integrated circuit device includes a MOSFET 412 that can constitute an internal circuit. A source of MOSFET 412 can be connected with a reference electric potential wiring 117 through another MOSFET 411. Further, a CDM protective device 413 can be provided between a gate and source of MOSFET 412. A CDM protective device 413 can be provided to prevent a gate oxide film from being broken down due to a high electric field between a gate and source of a MOSFET 412.

A reference electric potential wiring resistance Rg, when viewed from a CDM protective device 413, can comprise the sum of a reference electric potential wiring resistance component 116 and effective channel resistance of a MOSFET 411. A CDM protective device 414 can be provided between a gate of internal circuit MOSFET 412 and a reference electric potential wiring resistance 117 to help prevent a gate oxide film from being broken due to a high electric field between a gate of internal circuit MOSFET 412 and a substrate (reference electric potential wiring level). Rg viewed from CDM protective device 414 can be a reference electric potential wiring resistance 116. According to the present embodiment, an input resistance Rin can be optimized for sizes of both a CDM protective devices 413 and 414 and/or a reference electric potential wiring resistance Rg.

It is noted that a gate of MOSFET 411 may receive a signal from another internal circuit, or receive a signal applied from a outside terminal. In the latter case, a CDM protective device may be needed between the gate and the source of MOSFET 411 (not shown).

Figure 10:
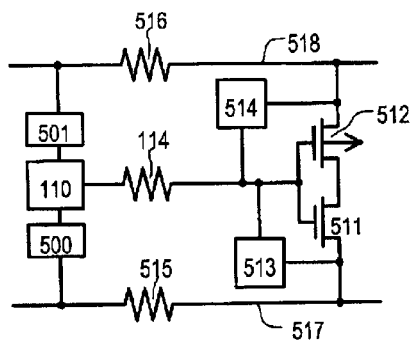
FIG. 10 is a circuit diagram illustrating an example of a modification of a fifth embodiment.

Of course, while various embodiments have described arrangements that include N channel MOSFETS, the present invention may also be applied to P channel MOSFETs. As but one example, FIG. 10 shows a circuit having a P channel MOSFET 512. In FIG. 10, an input resistance 114, wiring resistance component 516 of power supply electric potential wiring 518, and a CDM protective device 514 can be optimized for P channel MOSFET 512 based upon the same considerations described above. Thus, an arrangement such as that shown in FIGS. 8 and 9 may include both N and P channel MOSFETs, and may have CDM withstand values optimized according to the properties of such different conductivity MOSFETs. In this way, the present invention can provide a semiconductor integrated circuit device having high CDM withstand amounts for various different types of input circuits.

Sixth Embodiment.

A method for designing a semiconductor integrated circuit device according to the present invention will now be described. In the present designing method a semiconductor integrated circuit device can be designed using a process device simulator.

The following method will be described with reference to a number of steps (1) to (6).

(1) A CDM test by may be actually executed on a test device. From such an actual CDM test, a relationship between a CDM withstand amount and a ratio (Rg/Rin) between a reference electric potential wiring resistance Rg and input resistance Rin may be determined.

(2) A value for a ratio (Rg/Rin) may be estimated that can satisfy a target CDM withstand amount. For example, an estimated (Rg/Rin) value of about 0.2 may correspond to a target CDM withstand amount of about 1000 volts. FIG. 11 is but one example of data values that may be used to estimate (Rg/Rin) values for a corresponding CDM withstand voltage.

Figure 16:
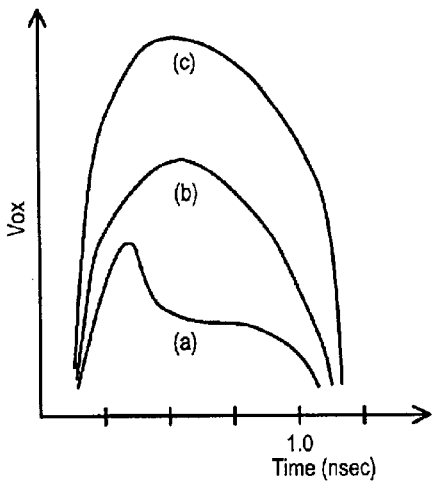
FIG. 16 shows simulation waveforms illustrating a temporal change in gate-source voltage of a MOSFET upon a CDM test.
Figure 17:
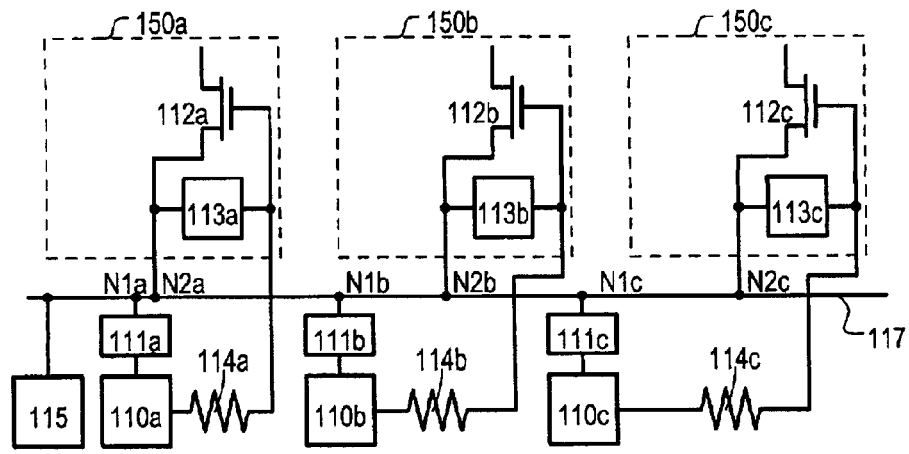
FIG. 17 is a circuit diagram illustrating the arrangement of a conventional semiconductor integrated circuit device.
Figure 18:
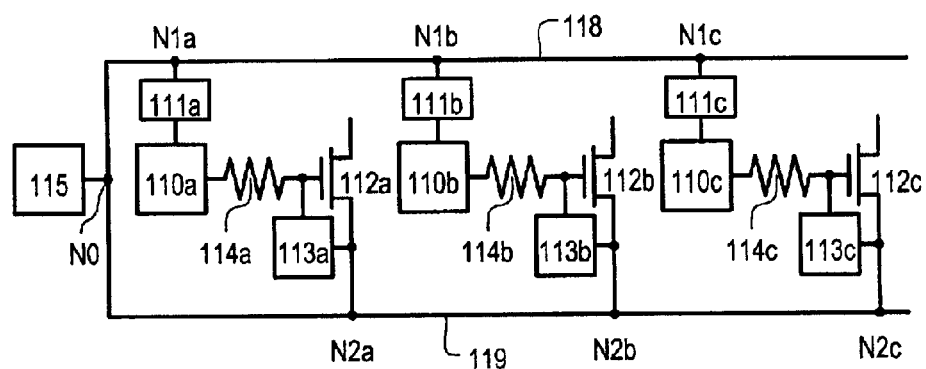
FIG. 18 is a circuit diagram illustrating another arrangement of a conventional semiconductor integrated circuit device.

(3) An electric potential difference (Vox) between the gate electrode and the source electrode of MOSFET can be estimated. Such a value may be for a MOSFET that constitutes an internal circuit using process/device simulation. Temporal dependency of electric potential difference Vox such as illustrated in FIG. 16 may be obtained.

Figure 12:
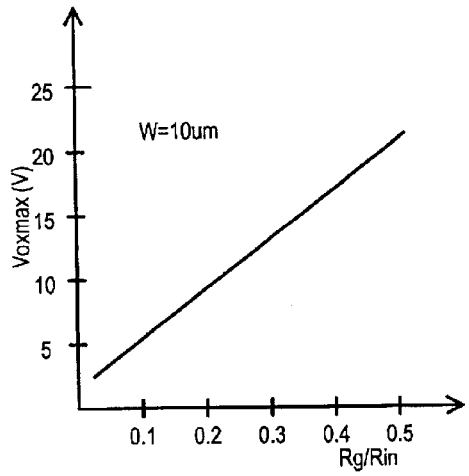
FIG. 12 is a graph illustrating a relationship between a maximum gate-source voltage of a MOSFET in a test device and resistance ratio Rg/Rin.

(4) A potential Vox that satisfies a given CDM withstand voltage may then be determined from a (Rg/Rin) value estimated in step (2). For example, a Vox value of 10 volts could be determined from an estimated (Rg/Rin) value of 0.2. A maximum Vox value may thus be determined. FIG. 12 shows one example of a how a Vox value may correspond to a ratio (Rg/Rin).

Figure 13:
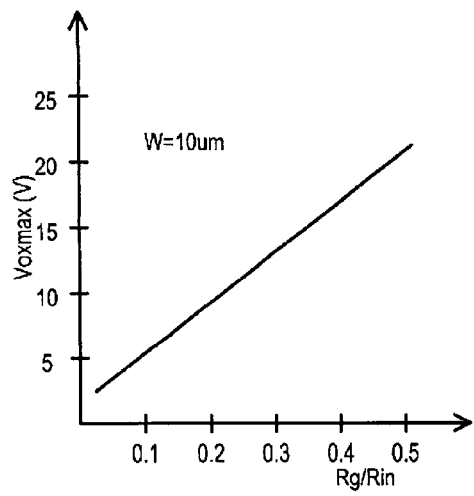
FIG. 13 is a graph illustrating a relationship between a maximum gate-source voltage of a MOSFET in a test device and resistance ratio Rg/Rin.

(5) From a chip size and lead configuration of an actual product, and by correcting for an equivalent capacitance (C0) between a chip and the ground for simulation, a relationship between a value Vox max and a ratio (Rg/Rin) may be determined. An example of such a relationship is shown in FIG. 13. A value of a ratio (Rg/Rin) in a product may then be determined that can satisfy a CDM withstand voltage estimated in step (4). As but one example, a ratio Rg/Rin=0.15 may be determined from a Vox value of estimated in a previous step (4).

(6) A device may then be designed by determining a value of Rg or Rin so as to satisfy the result of (5).

In accordance with design method of a sixth embodiment, a semiconductor integrated circuit device may have a sufficient CDM withstand amount at all input terminals and output terminals.

It is understood that while the above method has described altering values of Rg and/or Rin. Circuit characteristics and/or layout limitations may prevent desired changes from taking place. In such cases, a size of a CDM protective device may be changed to arrive at a desired withstand value.

Seventh Embodiment.

As noted above, there may be cases where it is desirable to change a size of a CDM protective device due to limitations in design and/or layout. In the following, a designing method will be described as a series of steps.

(1) An electric potential difference Vox max that satisfies the CDM withstand voltage can be estimated according in steps (1) to (4) of a sixth embodiment.

Figure 14:
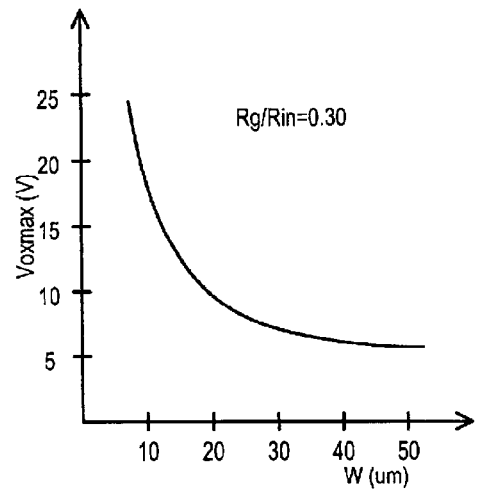
FIG. 14 is a graph illustrating a relationship between a maximum gate-source voltage of a MOSFET and the size of a CDM protective device.
Figure 15:
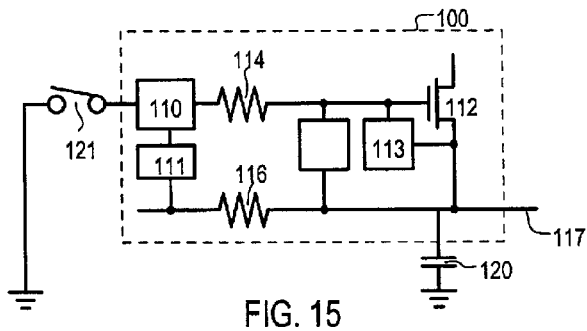
FIG. 15 is a schematic diagram illustrating an electrostatic breakdown mechanism of a conventional semiconductor integrated circuit device and a general counter measure.

(2) An equivalent capacitance (C0) between a chip and ground can be corrected for simulation from a chip size and lead configuration of an actual product. At this time, a relationship between C0 and a Vox max value may be estimated according to changes in a size of a CDM protective device. FIG. 14 illustrates the just-mentioned relationship between a Vox max value and CDM device size for a given Rg/Rin ratio of 0.30.

A size of a CDM protective device can be determined so as to satisfy the result of (1) for designing the device.

As one very particular example, as shown in FIG. 14, when the size W of the CDM protective device is 10 micrometers, Vox max can be about 17 volts. For a value of Vox max of 10 volts or lower (described in previous examples) a size W of a CDM protective device can be about 18 micrometers or more.

In the designing method described herein, a size of a CDM protective device can be optionally sized, so that there may be more flexibility of the layout design.

Of course, while the above example describes alternating a CDM protective device size, alternatively, a structure of the CDM protective device could be altered.

Although the preferred embodiments of the present invention were described in detail with reference to the accompanying drawings, the present invention should not be construed as being limited to the particular embodiments.

As but one example, although in the foregoing embodiments have shown three MOSFETs as examples of an internal circuit, the number of MOSFETs can be increased according to a design. Still further, the sizes of CDM protective devices disclosed in the embodiments or the value of reference electric potential wiring resistance Rg are by way of example, and could be changed in response to particular application requirements, specifications, etc.

One skilled in the art would recognize that the same methods for ensuring a maximum voltage is not exceeded between an IGFET gate electrode and source/drain electrode can be used to ensure that a maximum voltage is not exceeded between an IGFET gate electrode and substrate electrode.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor integrated circuit device, comprising:
a plurality of insulated gate field effect transistors IGFETs coupled to a corresponding input/output (I/O) terminal through a corresponding first resistance;
a first clamping device coupled to each I/O terminal;
a second clamping circuit corresponding to each IGFET, each second clamping circuit including a second clamping device and the corresponding first resistance, each second clamping device having a first terminal connected to a gate electrode of the corresponding IGFET and a second terminal connected to a source/drain terminal of the corresponding IGFET and a supply potential wiring;
each first clamping device being coupled to one second clamping device through a second resistance; and
at least two of the second clamping circuits vary from one another wherein
the at least two second clamping circuits vary by a first resistance (Rin) of one second clamping circuit having a different value than the first resistance (Rin) of the other second clamping circuit, and a ratio between the second resistance and the first resistance (Rg/Rin) for both clamping circuits having a predetermined maximum value.

2. A semiconductor integrated circuit device, comprising:
a plurality of insulated gate field effect transistors IGFETs coupled to a corresponding input/output (I/O) terminal through a corresponding first resistance;
a first clamping device coupled to each I/O terminal:
a second clamping circuit corresponding to each IGFET, each second clamping circuit including a second clamping device and the corresponding first resistance, each second clamping device having a first terminal connected to a gate electrode of the corresponding IGFET and a second terminal connected to a source/drain terminal of the corresponding IGFET and a supply potential wiring;
each first clamping device being coupled to one second clamping device through a second resistance; and
at least two of the second clamping circuits vary from one another wherein
the corresponding first resistance includes an effective channel resistance of an input path IGFET.

3. A semiconductor integrated circuit device, comprising:
a plurality of insulated gate field effect transistors IGFETs coupled to a corresponding input/output (I/O) terminal through a corresponding first resistance;
a first clamping device coupled to each I/O terminal;

a second clamping circuit corresponding to each IGFET, each second clamping circuit including a second clamping device and the corresponding first resistance, each second clamping device having a first terminal connected to a gate electrode of the corresponding IGFET and a second terminal connected to a source/drain terminal of the corresponding IGFET and a supply potential wiring;

each first clamping device being coupled to one second clamping device through a second resistance; and at least two of the second clamping circuits vary from one another wherein
the second resistance comprises essentially a supply potential wiring resistance and a contact resistance where the first and second clamping devices are connected to the supply potential wiring.

4. A semiconductor integrated circuit device, comprising:

a plurality of insulated gate field effect transistors IGFETs coupled to a corresponding input/output (I/O) terminal through a corresponding first resistance;

a first clamping device coupled to each I/O terminal;

a second clamping circuit corresponding to each IGFET, each second clamping circuit including a second clamping device and the corresponding first resistance, each second clamping device having a first terminal connected to a gate electrode of the corresponding IGFET and a second terminal connected to a source/drain terminal of the corresponding IGFET and a supply potential wiring;

each first clamping device being coupled to one second clamping device through a second resistance; and at least two of the second clamping circuits vary from one another wherein
each first clamping devices has a first terminal connected to one of the I/O terminals and a second terminal, the second terminals of each first clamping device being connected to the second terminal of one of the second clamping devices by system wiring of at least one supply terminal; and
the second resistance comprises essentially a contact resistance between the second terminal of the first clamping device and the supply potential wiring, a supply potential wiring between the first clamping device and the supply terminal, a supply terminal resistance, a supply potential wiring between the supply terminal and the second terminal of the second clamping device, and a contact resistance between the second terminal of the second clamping device and the supply potential wiring.

5. A method for designing a protective circuit for a semiconductor integrated circuit device that includes insulated gate field effect transistors IGFETs formed thereon, the method comprising the steps of:

executing a simulation with a predetermined charged device model (CDM) equivalent circuit that includes a first clamping device connected to an input/output (I/O) terminal, a first IGFET having a gate connected to the I/O terminal through a first resistance (Rin), a second clamping device connected between gate and source/drain terminals of the first IGFET and connected to a supply potential wiring, the first and second clamping devices being connected to one another through a second resistance (Rg); and selecting a ratio of the second resistance and the first resistance (Rg/Rin) that prevents a potential between the gate and source/drain terminal of the first IGFET from exceeding a predetermined value.

6. The method of claim 5, wherein:

the predetermined value is determined from a relationship between CDM test results and ratios of the second resistance and the first resistance (Rg/Rin), and simulation results showing a relationship between a potential between the gate and source/drain terminal of the first IGFET and ratios of the second resistance and the first resistance (Rg/Rin).

7. The method of claim 5, wherein:

the first and second resistance values are set to ranges that ensure predetermined circuit characteristics.

8. The method of claim 5, further including:

changing the properties of a second clamping device for a second IGFET to prevent a potential between the gate and source/drain terminal of the first IGFET from exceeding a predetermined value.

9. The method of claim 8, wherein:

the changing the properties of the second clamping device includes changing the size of the second clamping device.

* * * * *